United States Patent [19]
Hendrickson

[11] Patent Number: 5,966,416
[45] Date of Patent: Oct. 12, 1999

[54] VERIFICATION OF PN SYNCHRONIZATION IN A SPREAD-SPECTRUM COMMUNICATIONS RECEIVER

[75] Inventor: Alan F. Hendrickson, Austin, Tex.

[73] Assignee: DSP Group, Inc., Santa Clara, Calif.

[21] Appl. No.: 08/968,030

[22] Filed: Nov. 12, 1997

Related U.S. Application Data

[60] Provisional application No. 60/031,350, Nov. 21, 1996.

[51] Int. Cl.⁶ ...................................................... H04L 7/00
[52] U.S. Cl. ........................................... 375/367; 375/208
[58] Field of Search ..................................... 375/200, 206, 375/207, 208, 209, 210, 367; 370/515, 503, 342, 441, 479, 509; 371/3, 5.4, 46

[56] References Cited

U.S. PATENT DOCUMENTS

| | | | |
|---|---|---|---|
| 4,279,018 | 7/1981 | Carson . | |
| 5,315,616 | 5/1994 | DeLisle et al. | 375/200 |
| 5,375,141 | 12/1994 | Takahashi | 375/200 |
| 5,574,754 | 11/1996 | Kurihara et al. | 375/367 |
| 5,696,766 | 12/1997 | Yeung et al. . | |
| 5,745,496 | 4/1998 | Lysejko . | |
| 5,844,935 | 12/1998 | Shoji | 375/200 |

FOREIGN PATENT DOCUMENTS

| | | |
|---|---|---|
| 3131186A1 | 2/1983 | Germany . |
| 3806394A1 | 9/1989 | Germany . |
| WO93/15573 | 8/1993 | United Kingdom . |

OTHER PUBLICATIONS

Sklar, "digital Communication: Fundamentals and Applications," published by Prentice Hall, Englewood Cliffs, New Jersey, 1988, Chapter 10: Spread–Spectrum Techniques—Section 10.5 (pp. 562–570).

PCT/US 97/21369, International Search Report Nov. 21, 1997.

*Primary Examiner*—Chi H. Pham
*Assistant Examiner*—Jean B. Corrielus
*Attorney, Agent, or Firm*—Conley, Rose & Tayon; Cyrus F. Bharucha; Jeffrey C. Hood

[57] ABSTRACT

A system for recognizing degraded pseudo-random noise (PN) synchronization in a spread-spectrum receiver. The system uses a signal that indicates the correlation of the locally generated PN sequence with the received PN sequence. The correlation signal can be a symbol-length integration of the output from a square-law detector, or an appropriate similar signal. If the correlation signal is not degraded by demodulating with a deliberately shifted copy of the PN sequence, there is an indication that the unshifted PN sequence was itself not correctly synchronized. A sufficiently degraded correlation signal indicates that the receiver's PN synchronization is correct. To prevent the loss of transmitted data during the testing, each transmitted frame contains a Measurement field (that contains no payload data) for assessing the synchronization in this manner. The PN sequence is shifted only during this specific portion of the received frame.

28 Claims, 5 Drawing Sheets

Operation of the PN demodulator.

Spread-spectrum transceiver.

FIG. 1

Frame sequence in a TDD system.

FIG. 2

Outline of a receive frame.

FIG. 3

Operation of the PN demodulator.

Block diagram of the despreading and synchronization-verifying system.

Flowchart for constructing, transmitting, receiving, and despreading the received frame.

FIG. 6

VERIFICATION OF PN SYNCHRONIZATION IN A SPREAD-SPECTRUM COMMUNICATIONS RECEIVER

This application claims benefit of priority of U.S. Provisional Application No. 60/031,350, titled "Spread Spectrum Cordless Telephone System and Method" and filed Nov. 21, 1996, whose inventors were Alan Hendrickson, Paul Schnizlein, Stephen T. Janesch, and Ed Bell.

BACKGROUND OF THE INVENTION

1. Field of the Invention

The invention relates to electronic communication and, more particularly, to the synchronization of a pseudo-random noise sequence in a direct-sequence spread spectrum receiver.

2. Description of the Related Art

Direct-sequence spread-spectrum (DSSS) radio communication is accomplished with a carrier wave that is modulated by an information signal into a narrowband signal. The narrowband signal is further modulated by a spreading code, which broadens its spectrum, into the transmitted spread-spectrum signal. The spreading code is a pseudo-random noise (PN) sequence of symbols, called chips, that each have a short duration in comparison with the symbols of the information signal. Although the modulation with the PN sequence is typically performed after the carrier has been modulated to bear the information signal, it can alternatively be performed on the information signal before modulation onto the carrier.

In some communication systems that employ PN sequences with durations equal to or shorter than the symbol duration, the information signal is recovered by filtering the PN frequency components from the received spread-spectrum signal. In a typical receiver, however, the received spread-spectrum signal is despread by demodulating the PN sequence from it. Thus, these receivers need to generate a local copy of the PN sequence. The receiver demodulates the spread-spectrum signal with the locally generated PN sequence to extract the narrowband signal; it then demodulates the narrowband signal to reconstruct the information signal.

The despreading requires the receiver's locally generated PN sequence to be synchronized with the PN sequence modulated into the received signal. If the mismatch in timing is large (more than 1 chip), the despreading can not effectively restore the narrowband signal. The term "timing recovery" refers to the process of ensuring that the receiver's locally generated PN sequence is substantially synchronized with the PN sequence modulated into the received signal. There are two stages in the timing recovery of the PN sequence. In the first, the acquisition stage, the receiver acquires a coarse synchronization, generally to within ½ chip, between the receiver's locally generated PN sequence and the PN sequence of the received signal. Parallel-search (maximum likelihood), serial-search, or sequential-estimation circuits are typically used for coarse PN timing recovery. Delay-locked loops or tau-dither loops are then employed in the tracking stage, which maintains a fine PN synchronization. The tracking stage recovers a PN timing that is adequate for demodulating the narrowband signal from the received spread-spectrum signal.

The receiver can be improved by supplementing the tracking circuits with an independent system for recognizing a loss of PN synchronization. Upon detecting a degraded synchronization, the receiver can revert to the acquisition stage of the synchronization before an excessive amount of information is lost from improper demodulation. A procedure for recognizing degraded PN synchronization is thus a valuable addition to a spread-spectrum receiver.

SUMMARY OF THE INVENTION

The present invention comprises a system for recognizing degraded PN synchronization in a spread-spectrum receiver. The present invention uses a signal that indicates the correlation of the locally generated PN sequence with the received PN sequence. The correlation signal can be a symbol-length integration of the output from a square-law detector, or an appropriate similar signal. For a good PN sequence, the correlation of the PN sequence with itself is substantially larger (by an order of the sequence length) than the correlation of the sequence with a shifted copy of itself. The receiver compares a correlation signal from a supposedly synchronized PN sequence to a correlation signal from a different PN sequence, such as a deliberately shifted sequence, to determine if the first sequence was indeed correctly synchronized. If the correlation signal of the deliberately shifted PN sequence is not degraded relative to the supposedly synchronized PN sequence, there is a strong indication that the first PN sequence was itself not correctly synchronized.

The spread-spectrum signal is not properly despread while the PN sequence is shifted. Unless appropriate precautions are taken, transmitted data in the narrowband signal will be lost during the testing. Thus it is necessary to produce the correlation signal from the spread-spectrum signal without losing the data in the narrowband signal. To do this, in one embodiment of the present invention the receiver stores the received spread-spectrum signal and performs the testing at a later time, say during a transmit portion of a TDD (time-division duplex) frame. This method, however, requires a significant increase in complexity for the hardware used to store the received signal. This method also suffers from the loss of real-time testing. In a second embodiment the receiver includes a second PN demodulator that continually uses a shifted version of the PN sequence and generates the corresponding correlation signal. So long as the first correlation signal remains significantly larger than the second correlation signal, the PN synchronization is valid for the first PN demodulator. The addition of a second correlator, however, introduces an increased complexity in the design of the receiver.

A third embodiment of the receiver performs the testing in real-time and uses a single demodulator. To prevent the loss of transmitted data during the testing, the PN sequence is shifted only during a specific portion of the received frame that does not contain transmitted data. In this preferred embodiment the transmitted frames include a field reserved for the testing. In the preferred embodiment, each transmitted frame contains a Measurement field (or "M-field") for assessing the synchronization in this manner. This field contains no transmitted data; the symbols in this field are used only for evaluating the PN synchronization. The receiver uses a shifted PN sequence while despreading the received signal during the M-fields, and an unshifted (presumably synchronized) PN sequence while despreading the received signal at other times. A sufficiently degraded correlation signal indicates that the receiver's PN synchronization is indeed correct.

BRIEF DESCRIPTION OF THE DRAWINGS

Other objects and advantages of the invention will become apparent upon reading the following detailed description and upon reference to the accompanying drawings in which.

DETAILED DESCRIPTION OF THE PREFERRED EMBODIMENTS

The following patents and patent applications are hereby incorporated by reference in their entirety as though fully and completely set forth herein:

U.S. Provisional Application No. 60/031350 (docket # 5000-87300/TT1797), titled "Spread Spectrum Cordless Telephone System and Method" and filed Nov. 21, 1996, whose inventors are Alan Hendrickson, Paul Schnizlein, Stephen T. Janesch, and Ed Bell;

U.S. application Ser. No. 08/974,966 (docket # 5000-89500/TT1692), titled "Parity Checking in a Real-Time Digital Communications System" and filed Nov. 20, 1997, whose inventors are Alan Hendrickson and Paul Schnizlein; and U.S. Application Ser. No. 08/976,175 (docket # 5000-90200/TT1699), titled "Verification of PN Synchronization in a Direct-Sequence Spread-Spectrum Digital Communications System" and filed Sep. 4, 1998, whose inventor is Alan Hendrickson.

Figure 1:
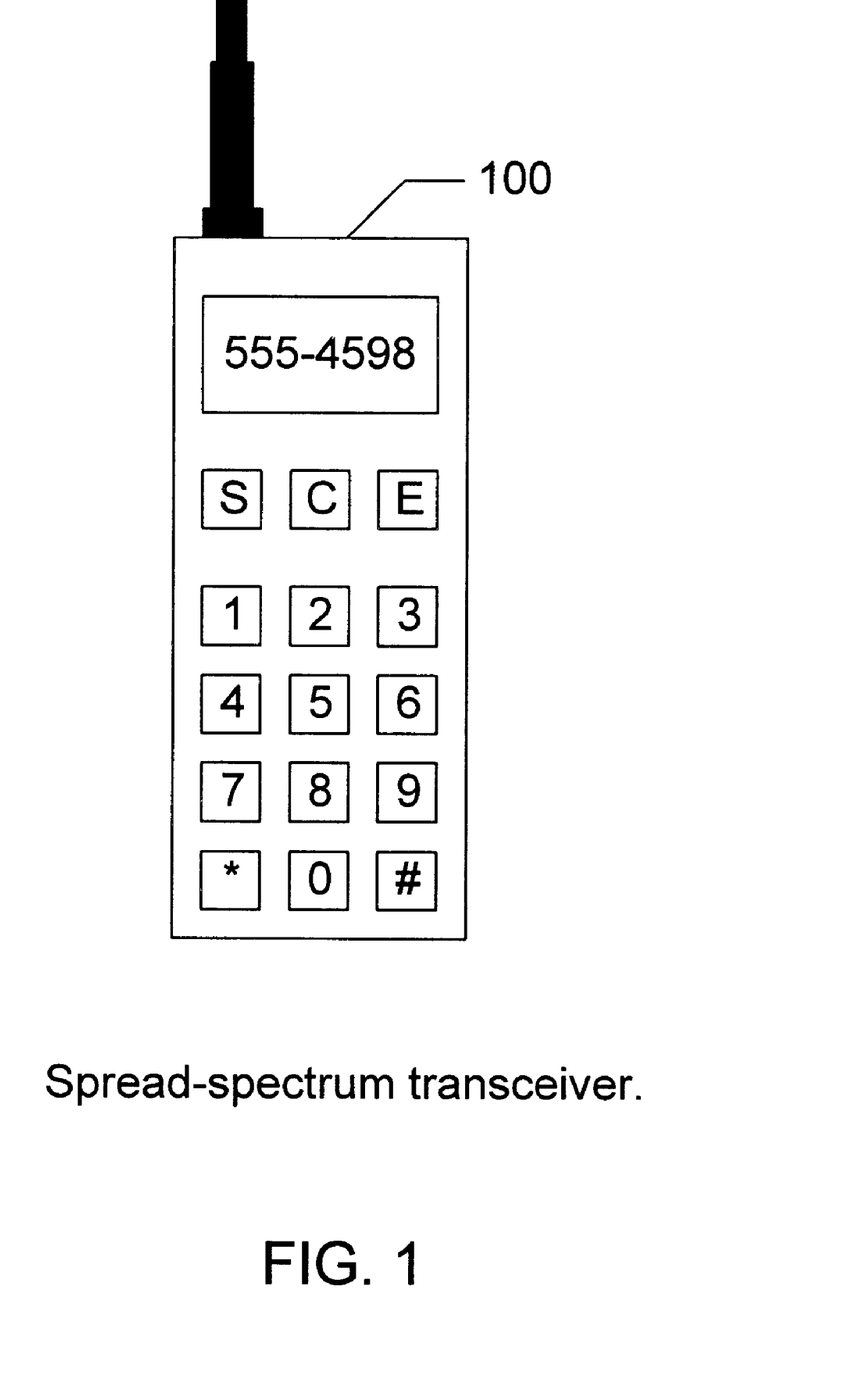
FIG. 1 is a representative view of a spread-spectrum transceiver.

FIG. 1: DSSS Communication Systems

A direct-sequence spread-spectrum (DSSS) communications transceiver 100 is illustrated in FIG. 1. The transceiver unit 100 can be used in cellular telephone networks, and is also readily adaptable to land-mobile communication networks, cordless telephones, and other communication systems. The transceiver unit 100 comprises a transmitter that sends a DSSS signal to other transceivers or to a base station, and a receiver that receives DSSS signals from the other transmitters. The receiver first demodulates the received spread-spectrum signal to remove the spreading code and extract the narrowband signal, and then demodulates the narrowband signal to produce the received information signal. The receiver has a locally generated copy of the pseudo-random noise (PN) sequence for demodulating the received signal. The receiver monitors the locally generated copy of the PN sequence periodically in a novel procedure described below to verify that it is synchronous with the transmit PN sequence in the received spread-spectrum signal.

Figure 2:
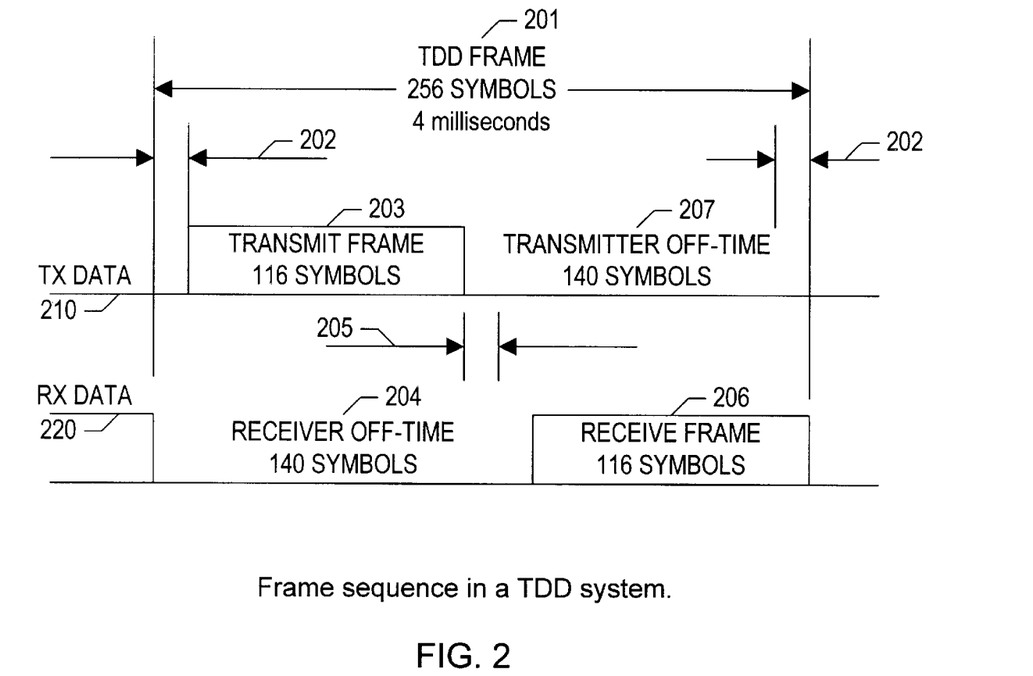
FIG. 2 illustrates a sample frame sequence in a TDD communication system.
Figure 3:
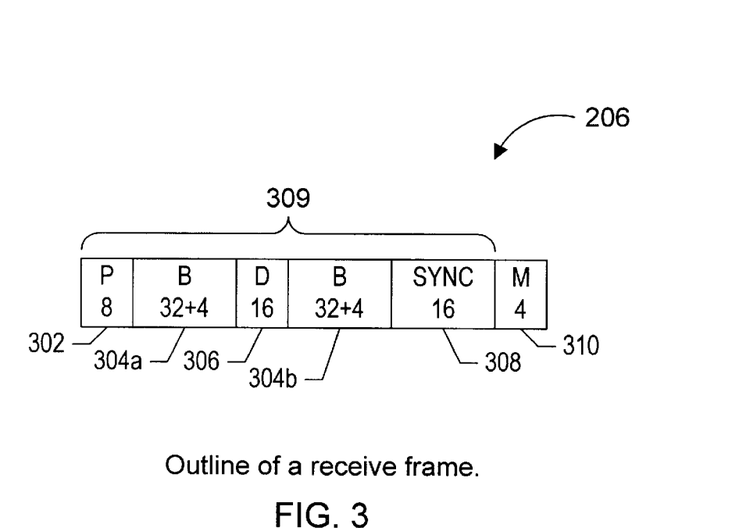
FIG. 3 shows a sample location of the M-field in a received frame.

FIG. 2 and FIG. 3: Data Frames

As shown in FIG. 2 and FIG. 3, digital communications systems generally divide the transmitted data into frames or packets—discrete quantities of data which have fields with specific lengths. The frame structure facilitates error checking, encryption, multiplexing of several data streams, and other communications procedures. For example, the frame structure in FIG. 2 allows time-division duplexing (TDD) between two transceivers 100. Here the transceivers 100 alternate between transmitting and receiving in each TDD frame 201, thereby accomplishing bi-directional communications on a single RF band. After receiving data, the transceiver 100 waits for a buffering gap of time 202 and then begins transmission of a transmit frame 203. During this time that the transmit data stream 210 is active, the receive data stream 220 has an off-time 204. The transmit frame 203 is timed to end before the receive frame 206 is received. After the transmit frame 203 ends the transceiver 100 prepares to receive the receive frame 206. After another buffering gap of time 205, the received frame 206 arrives, and the receive data stream 220 is active. During this time the transmit data stream 210 has an off-time 207. The TDD frame repeats, allowing continuing bi-directional use of the channel.

FIG. 3 shows an example receive frame 206 according to the preferred embodiment of the present invention. The frame 206 is subdivided into constituent fields. The Measurement field ("M-field") 310 is the section of the frame used in the current invention to verify PN synchronization. Other fields can for example carry frame preamble information 302, the payload voice data 304A and 304B, control data 306, and frame synchronization markers 308. Other fields can also be incorporated into the frame; the synchronization test of the current invention requires the presence of the M-field in the receive frame, and it places no constraints on the other fields.

Figure 4:
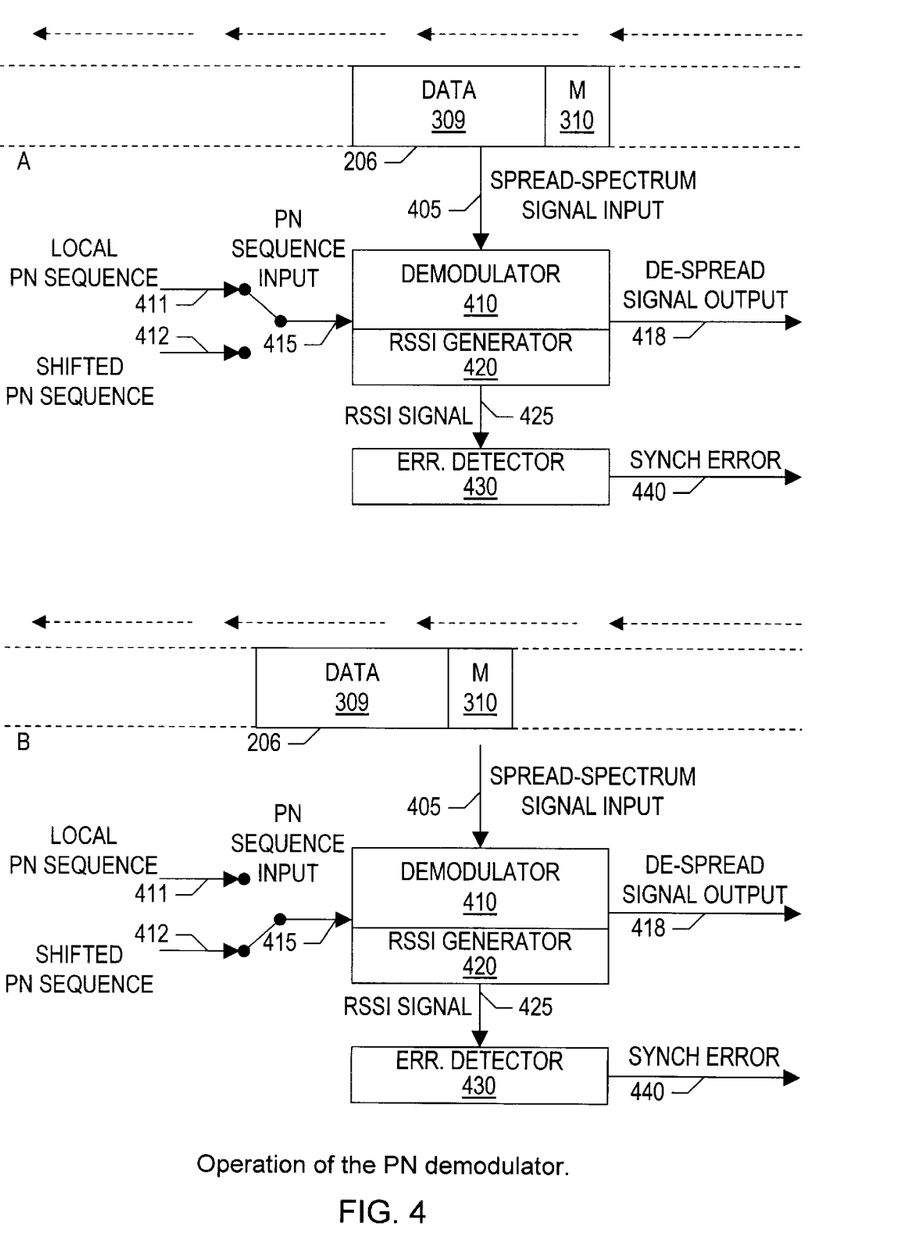
FIG. 4 shows the switching of the PN demodulator for the M-field.
Figure 5:
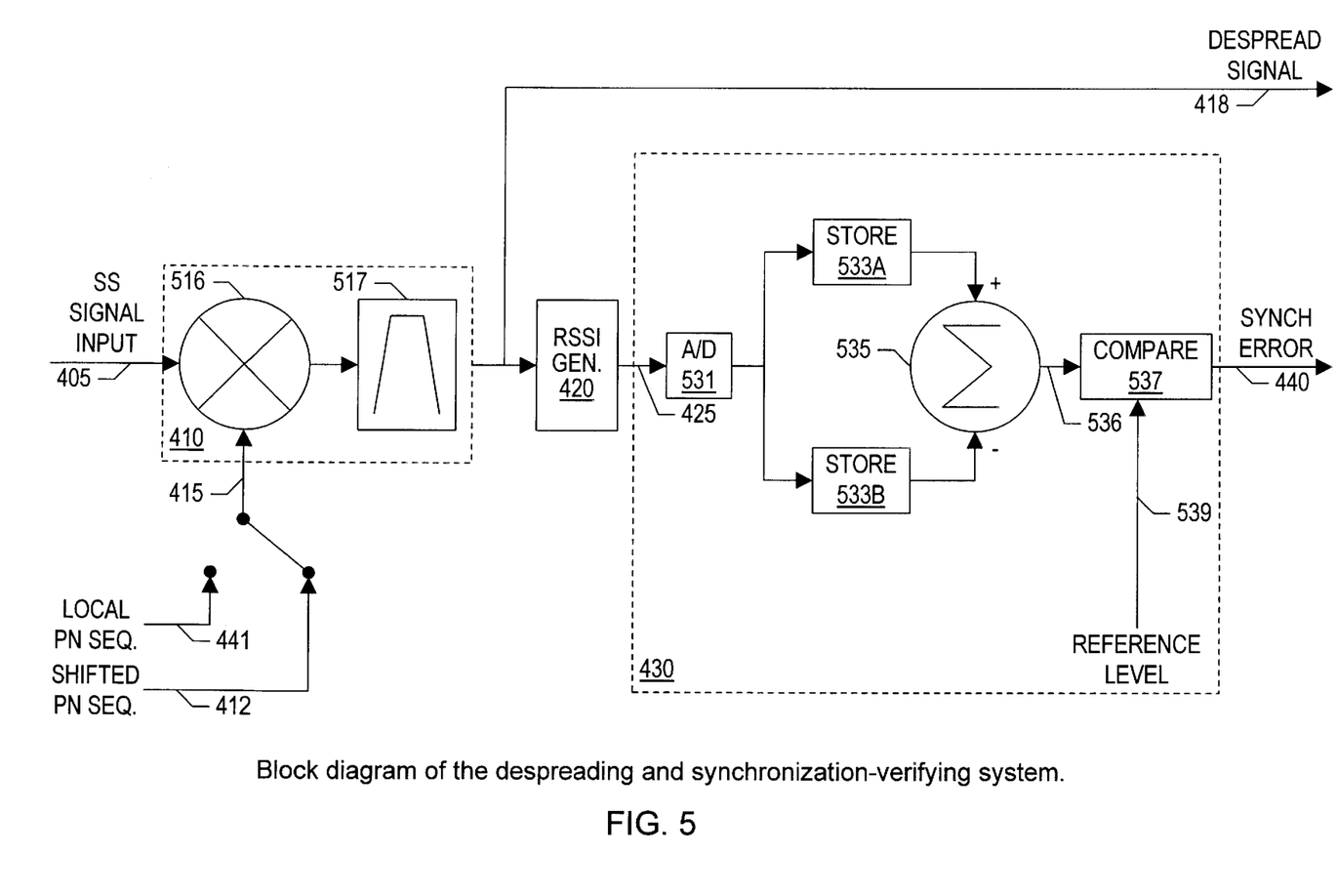
FIG. 5 is a block diagram of the PN demodulator and the error detector.
Figure 6:
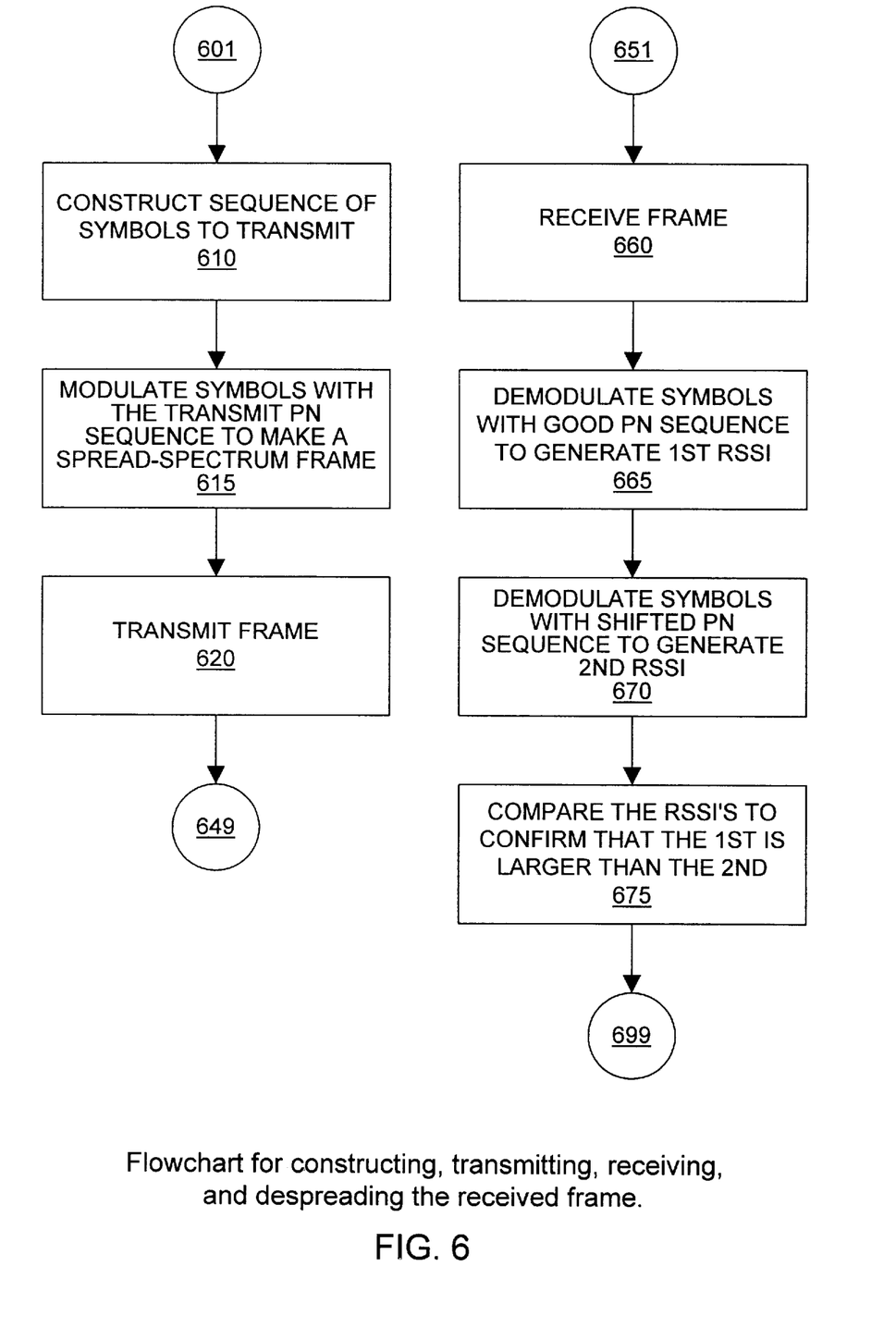
FIG. 6 sketches the sequence of steps for constructing, transmitting, receiving, and despreading a frame.

FIG. 4–FIG. 6: Detecting PN Synchronization Errors with the M-Field

In FIG. 4 the receive frame 206 is shown containing the M-field 310 and a data field 309 that includes all the fields (302–308 in FIG. 3) other than the M-field 310. The data in the field 309 are demodulated as shown in FIG. 4a. The received spread-spectrum signal 405 carrying the data field 309 is received by a demodulator 410. The demodulator 410 also receives a locally generated PN sequence 411 through a PN sequence input 415 and uses it to demodulate the received signal 405 into a de-spread signal 418. A correlator 420 works in conjunction with the demodulator 410 to generate a signal indicating the correlation of the local PN sequence 411 with the PN sequence used in the transmitter to generate the received signal 405. In this figure the correlator 420 is a received-signal strength indicator (RSSI) 420 that generates an RSSI signal 425. The RSSI signal 425 indicates the correlation of the local and transmitted PN sequences.

FIG. 4b shows the operation during the time the receiver receives an M-field 310 in a receive frame 206. This figure has the same components as FIG. 4a (and the numbering is the same for clarity). However, during the reception of the M-field 310, the demodulator 410 receives a second, preferably orthogonal, PN sequence. In one embodiment, the second PN sequence is a deliberately shifted copy of the locally generated PN sequence 412. In another embodiment, the second receive PN sequence is a random sequence. Without a correctly synchronized PN sequence, the demodulator 410 produces an incorrect signal output, and the RSSI generator produces a degraded RSSI signal. Assuming that the locally generated PN sequence 411 was correctly synchronized with the PN sequence of the received signal, the shifted PN sequence 412 should lead to a significantly degraded RSSI signal 425. If the change from the locally generated PN sequence 411 to the shifted PN sequence 412 during the M-field does not result in a degraded RSSI signal 425, then the locally generated PN sequence 411 was not properly synchronized with the PN sequence of the received signal. The error status is preferably determined by an error detector 430 which receives the RSSI signals 425 and generates an appropriate error signal 440.

One embodiment of the hardware used to generate the despread signal 418 and the error signal 440 is shown in the block diagram of FIG. 5. In this diagram, a mixer 516 in the demodulator 410 receives the spread-spectrum input signal 405 and the appropriate PN sequence 415 and multiplies the two signals. During the time that the mixer receives an M-field through the input 405, the shifted PN sequence 412 is provided to the mixer 516; during reception of other fields, the presumed correct PN sequence 411 is provided to the mixer 516. The resulting product from the mixer 516 is provided to a band-pass filter 517, also in the demodulator 410, which removes the extraneous frequency components to generate the despread signal 418. The RSSI generator 420 receives the despread signal 418 and generates an RSSI signal 425 that is substantially proportional to the logarithm of the power of the despread signal 418. An analog-to-digital converter 531 in the error detector 430 receives the RSSI signal 425 and digitizes it. The analog-to-digital converter 531 is one of several elements in the error detector 430. Other elements in the error detector include buffers 533A and 533B, a subtractor 535, and a comparator 537. The digitized output from the analog-to-digital converter 531 is stored in one of the two buffers 533A and 533B. One of these buffers 533A receives and holds a digitized RSSI corresponding to the presumed correct PN sequence 411; the other buffer 533B receives and holds a digitized RSSI corresponding to the shifted PN sequence 412. Since the RSSI is a logarithmic function, the difference between the values stored in buffers 533A and 533B indicates the ratio between the powers of the signals received with the two PN sequences 411 and 412. This difference is calculated by the subtractor 535, which receives the contents of the two buffers 533A and 533B. The difference signal 536 generated by the subtractor 535 is provided to the comparator 537. The comparator 537 generates the error signal 440 that is the output of the error detector 430. This output 440 indicates if the difference signal 536 is less than a reference level 539. In the preferred embodiment a degradation of the RSSI that indicates a drop in the narrowband signal level by $$10 \log\left(\frac{PN \text{ chip rate}}{\text{narrowband symbol rate}}\right) dB$$

is sufficient to demonstrate correct PN synchronization. The reference level 539 is therefore determined by this threshold.

Some elements of the error detector 430 can be implemented in either hardware or software. That is, some of these elements may be constructed of hardware elements dedicated to a single purpose, while other elements may have their functions performed by an embedded processor under the control of software. In one embodiment of the invention, the mixer 516, the filter 517, the RSSI generator 420, the analog-to-digital converter 531, and the buffers 533A and 533B, are hardware components of the transceiver 100. In this embodiment, the subtractor 535 and the comparator 537 are implemented in software that acts on the contents of the buffers 533A and 533B to generate the digital error signal 440.

FIG. 6 outlines the procedure for determining a PN synchronization error. The starting point 601 is when the transmitter prepares the transmit frame. The transmitter collects 610 the information symbols for the different data fields and adds to them a sequence of symbols that make the M-field. The M-field can be a random or predetermined sequence of symbols, but since the receiver is expected to not correctly despread the M-field, these symbols do not carry any payload data. In one embodiment of the method, the transmit frame is then spread 615 with the transmitter's PN sequence, and transmitted 620 to the receiver. In another embodiment, as the symbols in the frame are collected they are immediately spread 615 and transmitted 620. This brings the system to the conclusion 649 of a frame transmission.

In the preferred embodiment, the PN sequence is a maximal length sequence, with the property that its autocorrelation function has a strong peak at zero shift. More precisely, the correlation between the sequence and an unshifted version of itself has a value of 1, and the correlation between the sequence and any other shifted version of itself has a value of −1 divided by the sequence length. Also in this embodiment, the chip rate is chosen so that the PN sequence has a duration equal to the symbol duration in the narrowband signal.

In parallel with the transmission of a frame 601-649 by a transmitter in a transceiver, a receiver in a second transceiver receives the signal carrying the frame. After detecting 651 the beginning of a received frame in a spread-spectum signal, the receiver receives 660 the spread-spectrum signal and uses its (presumed correct) locally generated PN sequence to demodulate the portions of it not containing the M-field. The demodulation in step 665 provides the transmitted information symbols as well as the first RSSI signal. When the receiver demodulates the symbols from the M-field in step 670, it uses a shifted copy of its local PN sequence to generate the second RSSI. The two RSSI's are compared in step 675 to verify that the second is sufficiently degraded in relation to the first. The result of this comparison indicates whether or not the receiver's locally generated PN sequence is correctly synchronized. Thus, at the conclusion 699 of its analyses of the two RSSI's, the receiver has an indication of the validity of its PN synchronization.

Note that although the correlation measurement of the shifted PN sequence is depicted here as occurring after the measurement of the unshifted sequence, the order could be reversed: in one embodiment of the invention, the M-field is placed earlier in the frame so that its RSSI is generated prior to the RSSI of the other fields. However, in the preferred embodiment it is placed at the end of the frame so that resulting transients do not perturb reception of data-bearing information. In another embodiment, the M-field is positioned near but not at the end of the frame.

The purpose of the M Field is to provide a known portion of every frame in which the spreading sequence correlation is deliberately corrupted in order to compare the receive condition of an uncorrelated vs. a correlated spreading code, thereby yielding information on the condition of the correlation process. In addition to the evaluation of the PN synchronization, there are additional uses for this information.

In some cases another party or intruder transmitter interferes in the spread-spectrum frequency band, causing an increase in the receive signal strength. The M field allows the receiver to detect such in-band interferers, since the unsynchronized interferer will cause the RSSI during the M field to be comparable to the RSSI during other fields. Similarly, during fades, in which the received signal power temporarily drops, the RSSI measured with the correct PN sequence will not be significantly changed by shifting the PN sequence during the M field. The M field has the desirable function of dynamically maintaining the measurement of non-correlated noise, thereby allowing detection of fades and range-limited low SNR in addition to loss of PN synchronization and in-band interferers.

It is to be understood that multiple variations, changes and modifications are possible in the aforementioned embodiments of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

What is claimed is:

1. A method for verifying PN synchronization in a direct sequence spread spectrum communications receiver, the method comprising:
    receiving a frame, wherein said frame comprises a plurality of symbols modulated with a transmit pseudo-random noise "PN" sequence, wherein said frame includes data and a Measurement portion useable for verifying PN synchronization;
    demodulating symbols in said frame with a first receive PN sequence, wherein said first receive PN sequence is intended to approximate said transmit PN sequence;
    measuring a first correlation between said transmit PN sequence and said first receive PN sequence;
    in said Measurement portion of said frame, measuring a second correlation between said transmit PN sequence and a second receive PN sequence, wherein said second receive PN sequence differs from said transmit PN sequence; and
    comparing said second correlation with said first correlation to verify PN synchronization, wherein said comparing indicates an error if a difference between said first and second correlations is less than a predetermined threshold.

2. The method of claim 1, wherein said comparing indicates that said first receive PN sequence is synchronized with said transmit PN sequence if the difference between said first and second correlations is greater than or equal to the predetermined threshold.

3. The method of claim 1, wherein the second receive PN sequence is substantially orthogonal to the first receive PN sequence.

4. The method of claim 1, wherein the second receive PN sequence is a random sequence.

5. The method of claim 1, wherein the second receive PN sequence is a shifted copy of the first receive PN sequence.

6. The method of claim 1, wherein the first receive PN sequence is a maximal-length PN sequence and the second receive PN sequence is a shifted copy of the first receive PN sequence.

7. The method of claim 1, wherein said measuring a first correlation comprises generating a first receive signal strength indicator "RSSI" signal, wherein said measuring a second correlation comprises generating a second RSSI signal, and wherein said comparing said second correlation with said first correlation comprises comparing said second RSSI signal with said first RSSI signal.

8. The method of claim 1, wherein said Measurement portion of said frame useable for verifying PN synchronization is positioned near the end of said frame to reduce the effects of resulting transients.

9. The method of claim 1, wherein said Measurement portion of said frame useable for verifying PN synchronization comprises a predetermined symbol sequence.

10. The method of claim 9, further comprising:
    constructing said frame of transmit symbols, wherein said constructing said frame includes positioning said predetermined symbol sequence in said Measurement portion of said frame;
    modulating said frame with said transmit PN sequence; and
    transmitting said frame.

11. The method of claim 10, wherein said constructing said frame, modulating said frame, and transmitting said frame occurs prior to said receiving said frame.

12. The method of claim 10, wherein said constructing said frame, modulating said frame, and transmitting said frame occurs in parallel with said receiving said frame.

13. The method of claim 1, wherein said first and second correlations are measured in decibels, and wherein said predetermined threshold is determined in response to a PN chip rate and to a narrowband symbol rate of the direct sequence spread spectrum communications receiver and is given by the following formula:

$$10\log\left(\frac{PN\ \text{chip rate}}{\text{narrowband symbol rate}}\right)\text{dB}.$$

14. The method of claim 2, wherein said first and second correlations arc measured in decibels, and wherein said predetermined threshold is determined in response to a PN chip rate and to a narrowband symbol rate of the direct sequence spread spectrum communications receiver and is given by the following formula:

$$10\log\left(\frac{PN\ \text{chip rate}}{\text{narrowband symbol rate}}\right)\text{dB}.$$

15. A direct sequence spread spectrum communications receiver for receiving and demodulating direct-sequence spread-spectrum data, the receiver comprising:
    an input for receiving a frame, wherein said frame comprises a plurality of symbols modulated with a transmit pseudo-random noise "PN" sequence, wherein said includes data and a Measurement portion useable for verifying PN synchronization;
    a demodulator coupled to said input, wherein:
        said demodulator includes a first input for receiving said frame;
        said demodulator includes a second input for receiving a first receive PN sequence and a second receive PN sequence;
        said demodulator is configured to receive the first receive PN sequence and is configured to demodulate the plurality of symbols in said frame with said first receive PN sequence, wherein said first receive PN sequence is intended to approximate said transmit PN sequence; and
        said demodulator is configured to receive the second receive PN sequence and is configured to demodulate plurality of symbols in said Measurement portion of said frame with said second receive PN sequence, wherein said second receive PN sequence is intended to differ from said transmit PN sequence;
    a signal generator coupled to said demodulator, wherein:
        said signal generator is configured to generate a first correlation signal indicative of a first correlation between said transmit PN sequence and said first receive PN sequence, wherein said first correlation signal is generated in response to said demodulator demodulating said plurality of symbols in said frame with said first receive PN sequence; and said signal generator is configured to generate a second correlation signal indicative of a second correlation between said transmit PN sequence and said second receive PN sequence, wherein said second correlation signal is generated in response to said demodulator demodulating said plurality of symbols in said Measurement portion of said frame with said second receive PN sequence; and an error detector coupled to said signal generator, wherein said error detector receives said first and second correlation signals and wherein said error detector compares said second correlation signal with said first correlation signal, wherein said error detector indicates an error if said error detector determines that a difference between said first and second correlations is less than a predetermined threshold.

16. The receiver of claim 15, wherein said error detector indicates no error if said error detector determines that the difference between said first and second correlations is greater than the predetermined threshold.

17. The receiver of claim 15, wherein the second receive PN sequence is substantially orthogonal to the first receive PN sequence.

18. The receiver of claim 15, wherein the second receive PN sequence is a random sequence.

19. The receiver of claim 15, wherein the second receive PN sequence is a shifted copy of the first receive PN sequence.

20. The receiver of claim 15, wherein the first receive PN sequence is a maximal-length PN sequence and the second receive PN sequence is a shifted copy of the first receive PN sequence.

21. The receiver of claim 15, wherein:

said first receive PN sequence is used to demodulate a first plurality of symbols in said frame, wherein said first plurality of symbols is not in said Measurement portion of said frame;

said second receive PN sequence is used to demodulate a second plurality of symbols in said frame, wherein said second plurality of symbols is in said Measurement portion of said frame;

said first correlation signal is generated in response to said demodulator demodulating symbols not in said Measurement portion of said frame with said first receive PN sequence; and said second correlation signal is generated in response to said demodulator demodulating symbols in said Measurement portion of said frame with said second receive PN sequence.

22. The receiver of claim 15, wherein said signal generator comprises a receive signal strength indicator "RSSI" generator:

wherein said first correlation signal comprises a first RSSI signal;

wherein said second correlation signal comprises a second RSSI signal; and wherein said error detector operates to compare said second RSSI signal with said first RSSI signal.

23. The receiver of claim 15, wherein said Measurement portion of said frame usable for verifying PN synchronization is positioned near the end of said frame to reduce the effects of resulting transients.

24. The receiver of claim 15, wherein said Measurement portion of said frame useable for verifying PN synchronization comprises a predetermined symbol sequence.

25. The receiver of claim 15, wherein said first and second correlations are measured in decibels, and wherein said predetermined threshold is determined in response to a PN chip rate and to a narrowband symbol rate of the receiver and is given by the following formula:

$$10 \log \left( \frac{PN \text{ chip rate}}{\text{narrowband symbol rate}} \right) dB.$$

26. The receiver of claim 16, wherein said first and second correlations are measured in decibels, and wherein said predetermined threshold is determined in response to a PN chip rate and to a narrowband symbol rate of the receiver and is given by the following formula:

$$10 \log \left( \frac{PN \text{ chip rate}}{\text{narrowband symbol rate}} \right) dB.$$

27. A method for receiving and demodulating signals in a direct sequence spread spectrum communications system, the method comprising:

receiving a frame, wherein said frame comprises a plurality of symbols modulated with a transmit pseudo-random noise "PN" sequence, wherein said frame includes data, and a Measurement portion useable for verifying PN synchronization;

demodulating symbols in said frame with a first receive PN sequence, wherein said first receive PN sequence is intended to approximate said transmit PN sequence;

measuring a first correlation of said transmit PN sequence with said first receive PN sequence;

measuring a second correlation of said transmit PN sequence with a second receive PN sequence, wherein said measuring a second correlation is performed in said Measurement portion of said frame, and wherein said second receive PN sequence is intended to differ from said transmit PN sequence; and comparing said second correlation with said first correlation, wherein said comparing indicates an error if a difference between said first and second correlations is less than a predetermined threshold.

28. The method of claim 27, wherein said first and second correlations are measured in decibels, and wherein said predetermined threshold is determined in response to a PN chip rate and to a narrowband symbol rate of the direct sequence spread spectrum communications system and is given by the following formula:

$$10 \log \left( \frac{PN \text{ chip rate}}{\text{narrowband symbol rate}} \right) dB.$$

* * * * *

UNITED STATES PATENT AND TRADEMARK OFFICE
CERTIFICATE OF CORRECTION

PATENT NO. : 5,966,416

DATED : October 12, 1999

INVENTOR(S) : Alan Hendrickson

It is certified that error appears in the above-identified patent and that said Letters Patent is hereby corrected as shown below:

In the Claims:

Claim 14, col. 8, line 24, please delete "arc" and substitute --are--.

Claim 15, col. 8, line 39, please insert --frame-- between said and includes.

Claim 15, col. 8, line 56 please insert --the-- between demodulate and plurality.

Signed and Sealed this

Twenty-first Day of March, 2000

Attest:

Attesting Officer

Q. TODD DICKINSON

Commissioner of Patents and Trademarks